(12) United States Patent
Evangelista et al.

(10) Patent No.: US 9,470,985 B2
(45) Date of Patent: Oct. 18, 2016

(54) LITHOGRAPHIC APPARATUS, SENSOR AND METHOD

(71) Applicant: ASML Netherlands B.V., Veldhoven (NL)

(72) Inventors: Fabrizio Evangelista, Eindhoven (NL); Derk Jan Wilfred Klunder, Geldrop (NL); Cornelis Cornelia De Bruijn, Halsteren (NL)

(73) Assignee: ASML Netherlands B.V., Veldhoven (NL)

( * ) Notice: Subject to any disclaimer, the term of this patent is extended or adjusted under 35 U.S.C. 154(b) by 109 days.

(21) Appl. No.: 14/382,230

(22) PCT Filed: Feb. 21, 2013

(86) PCT No.: PCT/EP2013/053504
§ 371 (c)(1),
(2) Date: Aug. 29, 2014

(87) PCT Pub. No.: WO2013/139553
PCT Pub. Date: Sep. 26, 2013

(65) Prior Publication Data
US 2015/0062548 A1 Mar. 5, 2015

Related U.S. Application Data

(60) Provisional application No. 61/613,220, filed on Mar. 20, 2012.

(51) Int. Cl.
*G03F 7/20* (2006.01)
*G01J 1/04* (2006.01)
*G01J 1/42* (2006.01)

(52) U.S. Cl.
CPC ........... *G03F 7/7055* (2013.01); *G01J 1/0488* (2013.01); *G01J 1/429* (2013.01); *G03F 7/7085* (2013.01); *G03F 7/70558* (2013.01); *G03F 7/70958* (2013.01)

(58) Field of Classification Search
CPC ..... G01J 1/0488; G01J 1/429; G03F 7/7055; G03F 7/70558; G03F 7/7085; G03F 7/70958
See application file for complete search history.

(56) References Cited

U.S. PATENT DOCUMENTS 4,585,342 A 4/1986 Lin et al.
6,130,431 A * 10/2000 Berger .................. H01L 31/103
250/365

(Continued)

FOREIGN PATENT DOCUMENTS

CN 1828240 A 9/2006
CN 1933193 A 3/2007

(Continued)

OTHER PUBLICATIONS

English Abstract of App. No. CN 1828240 A, published Sep. 6, 2006; 1 page.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A lithographic apparatus comprises an illumination system configured to condition a radiation beam, a support constructed to support a patterning device, the patterning device being capable of imparting the radiation beam with a pattern in its cross-section to form a patterned radiation beam; a substrate table constructed to hold a substrate, a projection system configured to project the patterned radiation beam onto a target portion of the substrate, and a sensor. The sensor (S) comprises a photodiode (2) provided on a face (8) of a semiconductor substrate (4) towards which the radiation beam is directed during operation of the lithographic apparatus, a first radiation blocking material (10) being provided around the photodiode on the face of the semiconductor substrate, and a second radiation blocking material (12) is provided on a side (14) of the semiconductor substrate upon which the radiation beam is incident during operation of the lithographic apparatus.

18 Claims, 3 Drawing Sheets

(56) References Cited

U.S. PATENT DOCUMENTS

| | | | |
|---|---|---|---|
| 6,710,351 B2* | 3/2004 | Berger | B82Y 10/00 250/365 |
| 7,586,108 B2 | 9/2009 | Nihtianov et al. | |
| 8,138,485 B2 | 3/2012 | Nihtianov et al. | |
| 8,916,831 B2* | 12/2014 | Wang | G01N 21/956 250/372 |
| 2002/0037461 A1* | 3/2002 | Van Der Werf | G01J 1/58 430/30 |
| 2003/0001107 A1* | 1/2003 | Kroon | G03F 7/706 250/492.2 |
| 2003/0058429 A1* | 3/2003 | Schriever | B82Y 10/00 355/133 |
| 2004/0188627 A1* | 9/2004 | Panning | B82Y 10/00 250/372 |
| 2006/0163453 A1 | 7/2006 | Hynes et al. | |
| 2010/0044568 A1 | 2/2010 | Ishii et al. | |
| 2012/0268722 A1 | 10/2012 | Nihtianov et al. | |

FOREIGN PATENT DOCUMENTS

| | | |
|---|---|---|
| CN | 101107500 A | 1/2008 |
| CN | 101437777 A | 5/2009 |
| EP | 1 480 083 A2 | 11/2004 |
| EP | 1267212 B1 | 6/2008 |
| WO | WO 2011/105251 A1 | 9/2011 |

OTHER PUBLICATIONS

English Abstract of App. No. CN 1933193 A, published Mar. 21, 2007; 1 page.

English Abstract of App. No. WO 2011/105251 A1, published Sep. 1, 2011; 2 pages.

Canfield, L.R., et al., "Silicon photodiodes with integrated thin film filters for selective bandpasses in the extreme ultraviolet," Proceedings of SPIE, Ultraviolet Technology V, vol. 2282, 1994; pp. 31-38.

International Search Report directed to related International Patent Application No. PCT/EP2013/053504, mailed Oct. 14, 2013; 3 pages.

International Preliminary Report on Patentability and Written Opinion of the International Searching Authority directed to related International Patent Application No. PCT/EP2013/053504, issued Sep. 23, 2014; 6 pages.

\* cited by examiner

LITHOGRAPHIC APPARATUS, SENSOR AND METHOD

FIELD

The present invention relates to a lithographic apparatus, a sensor and a lithographic method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a normal or a grazing incidence radiation collector, which receives the radiation and focuses the radiation into a beam. The source collector apparatus may include an enclosing structure or chamber arranged to provide a vacuum environment to support the plasma. Typical EUV radiation sources are a discharge produced (DPP) source or a laser produced plasma (LPP) source.

It is desirable to measure various parameters during operation of an apparatus using an EUV radiation. These parameters may include the intensity of radiation being used to project a pattern onto a substrate, and the alignment of a wafer and a reticle. In addition, it is desirable to monitor for the presence of infrared radiation, since infrared radiation may cause damage to mirrors of the EUV apparatus.

SUMMARY

It may be desirable to provide a sensor capable of measuring properties of a EUV radiation, the sensor having an improved accuracy. According to a first aspect of the present invention there is provided a sensor for measuring a property of an in-band radiation, comprising a photodiode provided on a face of a semiconductor substrate, a first radiation blocking material being provided around the photodiode on the face of the semiconductor substrate, a second radiation blocking material being provided on a side of the semiconductor substrate, wherein the second radiation blocking material provides significant suppression of an out-of-band radiation.

The sensor comprises a photodiode provided on a face of a semiconductor substrate, a first radiation blocking material being provided around the photodiode on the face of the semiconductor substrate, a second radiation blocking material being provided on a side of the semiconductor substrate, wherein the second radiation blocking material may provide significant suppression of visible and DUV radiation.

The side of the semiconductor substrate may be substantially perpendicular to the face of the semiconductor substrate.

The second radiation blocking material may also be provided over the photodiode.

The second radiation blocking material may provide significant suppression of visible and DUV radiation but allows significant transmission of EUV radiation.

The second radiation blocking material may comprise zirconium or titanium nitride.

The second radiation blocking material may be not provided over the photodiode.

The second radiation blocking material may provide significant suppression of visible and DUV radiation.

The second radiation blocking material may provide significant suppression of EUV radiation.

The second radiation blocking material may comprise aluminium.

The photodiode may be one of a plurality of photodiodes provided on the face of the semiconductor substrate.

The sensor may be provided on a support, such as a support constructed to support a patterning device.

According to a second aspect of the present invention there is provided an apparatus comprising:

an optical system configured to condition a radiation beam; and a sensor arranged to receive part of a radiation beam, thereby allowing a property of the radiation beam to be measured before the radiation was conditioned by the optical system, or after being conditioned by the optical system;

the sensor comprising a photodiode provided on a face of a semiconductor substrate towards which the radiation beam is directed during operation of the apparatus, wherein a first radiation blocking material is provided around the photodiode on the face of the semiconductor substrate, and wherein a second radiation blocking material is provided on a side of the semiconductor substrate upon which the radiation beam is incident during operation of the lithographic apparatus.

The apparatus may be for example a lithographic apparatus, a radiation source apparatus which may be either stand-alone or integrated with the lithographic apparatus, a metrology apparatus or an inspection apparatus for measure properties of a surface, for example to measure properties of a patterned substrate.

An optical system may include various types of optical components, such as refractive, reflective, magnetic, electromagnetic, electrostatic or other types of optical components, or any combination thereof, for directing, shaping, or controlling radiation. By conditioning of the radiation beam is meant to change at least one of the radiation beam properties, such as providing a patterned radiation. In a lithographic apparatus, the optical system may comprise for example one or more of the following elements: an illumination system configured to condition a radiation beam, a patterning device, or a projection system configured to project the (patterned, if a patterning device is present) radiation beam onto a target portion of the substrate.

An apparatus according to the invention is for example a lithographic apparatus comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate. A sensor is provided in the lithographic apparatus, the sensor comprising a photodiode provided on a face of a semiconductor substrate towards which the radiation beam is directed during operation of the lithographic apparatus, a first radiation blocking material being provided around the photodiode on the face of the semiconductor substrate, and wherein a second radiation blocking material is provided on a side of the semiconductor substrate upon which the radiation beam is incident during operation of the lithographic apparatus.

According to a third aspect of the present invention there is provided a lithographic method comprising conditioning a radiation beam using an illumination system of a lithographic apparatus, and measuring the radiation beam using a sensor, the sensor comprising a photodiode provided on a face of a semiconductor substrate towards which the radiation beam is directed during operation of the lithographic apparatus, a first radiation blocking material being provided around the photodiode on the face of the semiconductor substrate, and a second radiation blocking material is provided on a side of the semiconductor substrate upon which the radiation beam is incident during operation of the lithographic apparatus.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 1 schematically depicts a lithographic apparatus according to an embodiment of the present invention.

Figure 4:
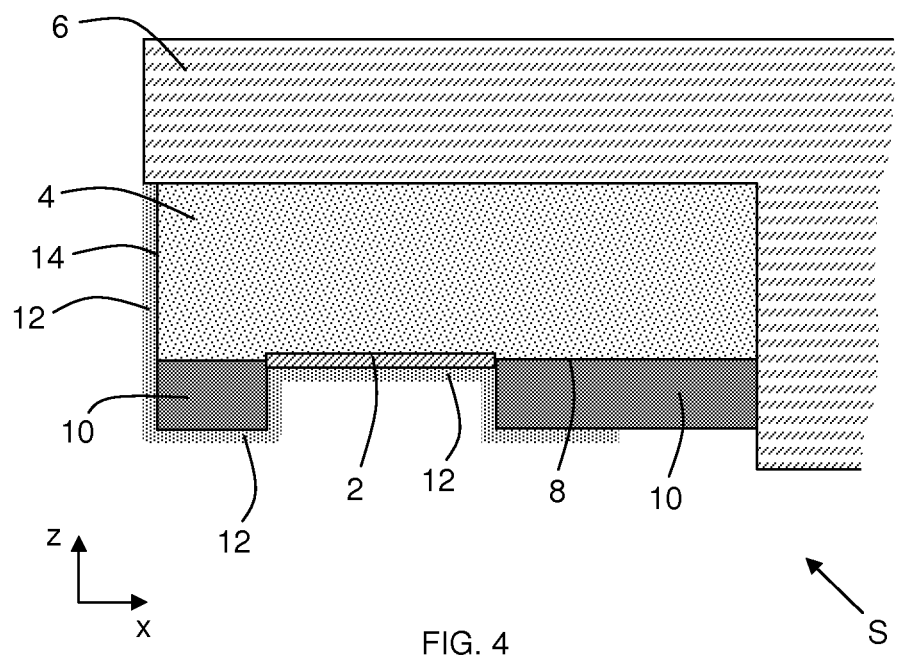

FIG. 4 schematically depicts a sensor according to an embodiment of the present invention.

Figure 5:
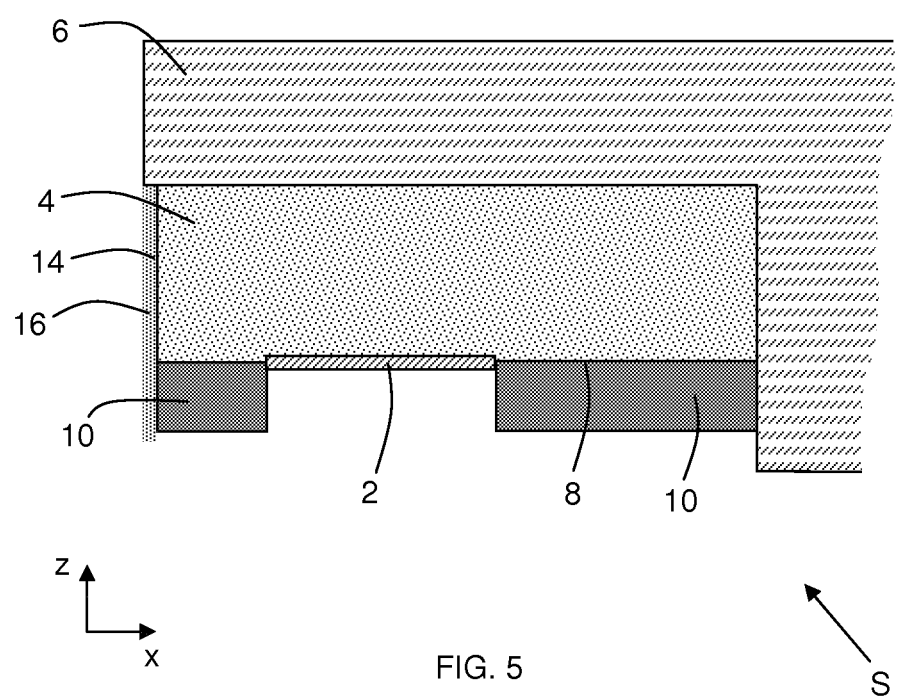

FIG. 5 schematically depicts a sensor according to an alternative embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
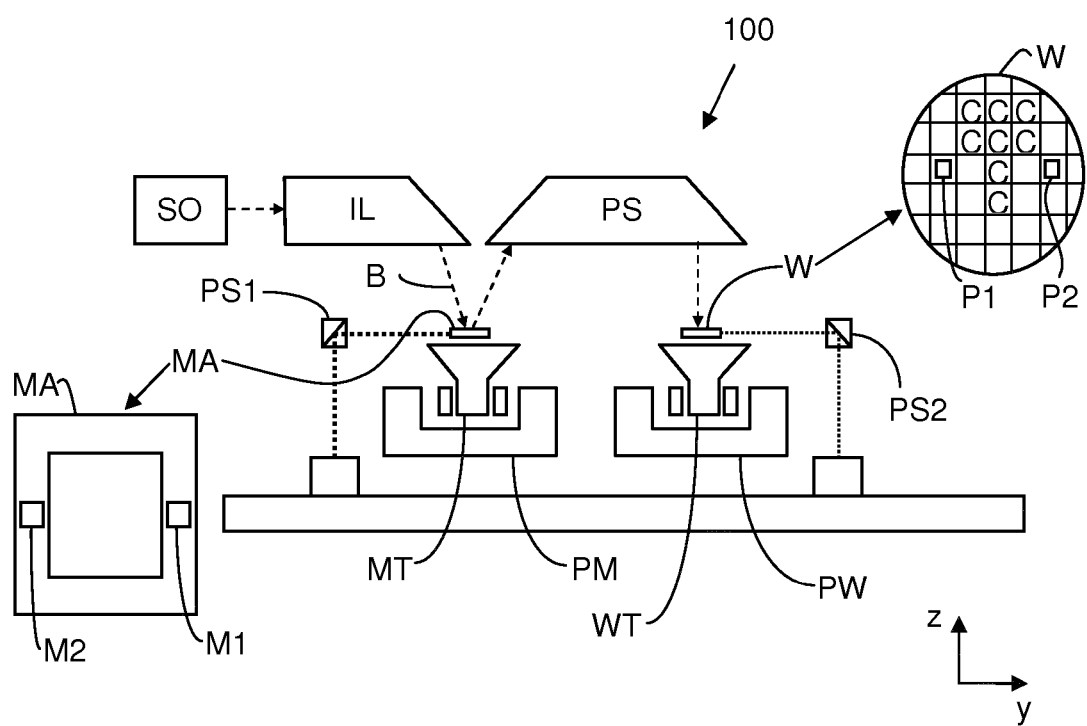

FIG. 1 schematically shows a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support MT holds the patterning device MA in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask)

MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.
2. In scan mode, the support (e.g., mask table) MT and the substrate table WT are scanned synchronously while a pattern imparted to the radiation beam is projected onto a target portion C (i.e., a single dynamic exposure). The velocity and direction of the substrate table WT relative to the support (e.g., mask table) MT may be determined by the (de-)magnification and image reversal characteristics of the projection system PS.
3. In another mode, the support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
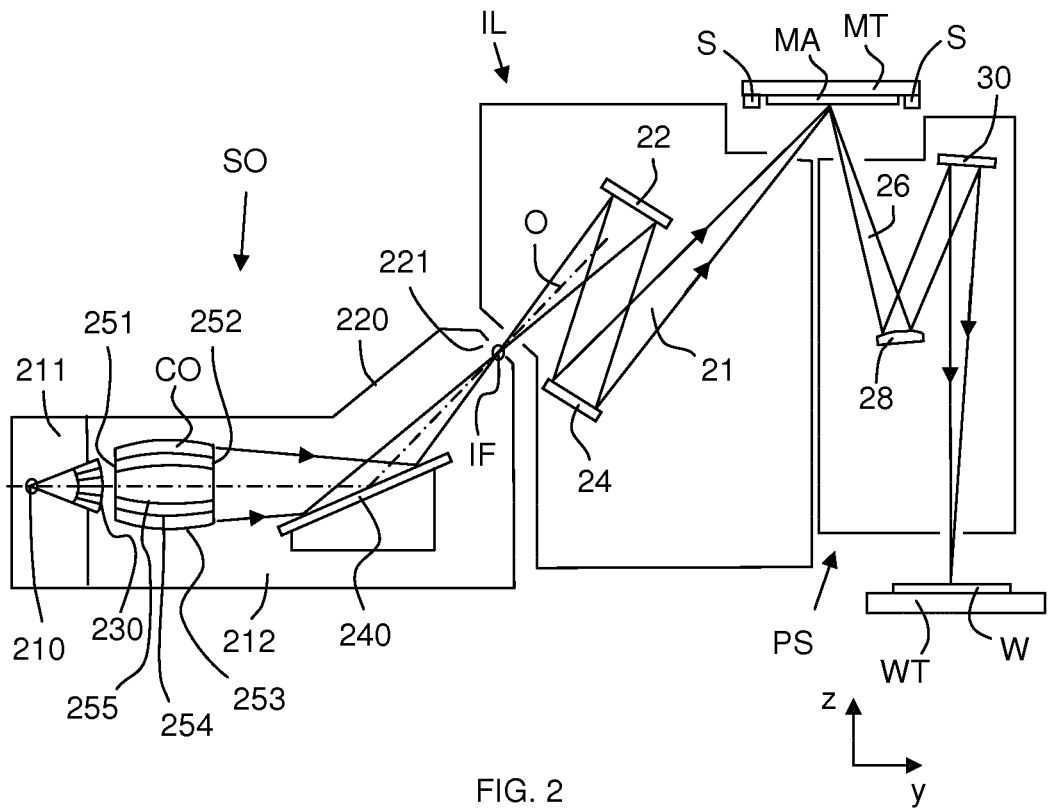
FIG. 2 is a more detailed view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
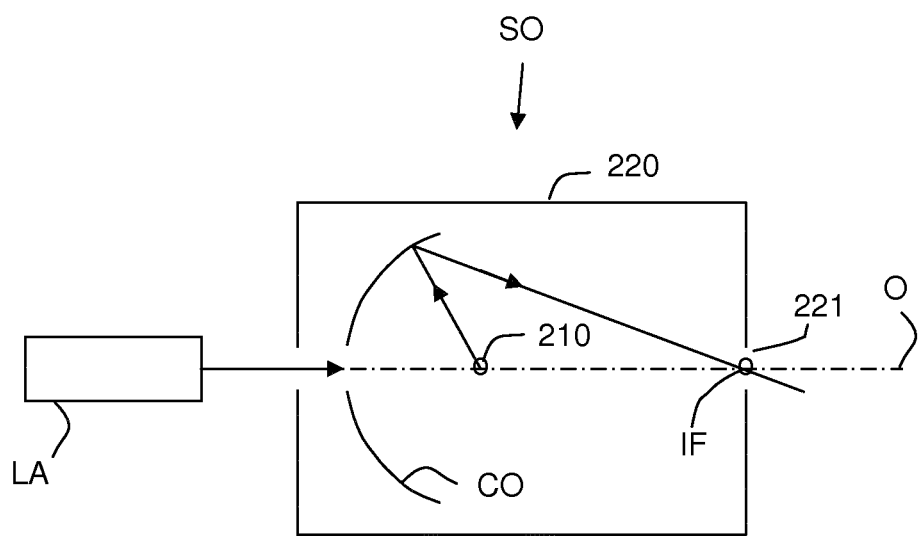
FIG. 3 is a more detailed view of a source collector apparatus of the apparatus of FIGS. 1 and 2.

The source collector apparatus SO may have any suitable form. For example, the source collector apparatus SO shown in FIG. 2 may be replaced with a source collector apparatus as shown in FIG. 3. The source collector apparatus SO shown in FIG. 3 is part of an LPP radiation system. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Referring again to FIG. 2, sensors S are provided on the support MT which holds the patterning device MA. The sensors are arranged to receive part of the radiation beam 21, thereby allowing a property of the radiation such as the intensity of the radiation beam to be measured. The sensors S may be positioned such that they receive part of the radiation beam 21 which lies beyond the perimeter of the patterning device MA. In an embodiment in which the lithographic apparatus is a scanning lithographic apparatus, the sensors S may be positioned such that they receive radiation from opposite ends of an exposure slit formed by the radiation beam 21 (the exposure slit is an area of radiation formed by the radiation beam which is used to illuminate the patterning device MA during a scanning exposure). The sensors S may be provided at any location in the lithographic apparatus at which it may be useful to measure a property of the radiation beam 21, such as the intensity of the radiation beam.

Radiation beam 21 generated by the plasma may have a broader range of wavelength than desired. The radiation beam 21 may be formed for instance by a part of a desired radiation herein named an "in-band" radiation, and a part of an undesired radiation herein named an "out-of-band" radiation. For example an in-band radiation may be a EUV radiation having a narrow wavelength range around a chosen average value, such as an average of 13.5 nm or of 6.8 nm. An "out-of-band" radiation is a radiation falling outside of the desired wavelength range, such as EUV radiation at a different wavelength, visible light, (near-)infra red radiation, UV and deep UV radiation. Besides being produced inherently by the plasma, the out-of-band radiation may also be created by other radiation sources such as the laser radiation exciting the plasma. It is desirable that sensor S measures with good accuracy a parameter related to the in-band radiation such that any noise coming from by the out-of-band radiation and disturbing the measurement signal is kept at minimum. Therefore, it is desirable to suppress out-of-band radiation from the measurement area of sensor S.

FIG. 4 schematically shows in cross-section one of the sensors S shown in FIG. 2 (rotated through 90° about the z-axis). The sensor comprises a photodiode 2 provided on a semiconductor substrate 4 (for example a Si substrate). The photodiode 2 is provided on a face 8 of the semiconductor substrate 4 towards which the radiation beam 21 (see FIG. 2) will be directed during operation of the lithographic apparatus. As will be understood from the description further above, only a portion of the radiation beam 21 is incident upon the sensor S (e.g., one end of the exposure slit). Thus, references to the radiation beam 21 being directed towards the face 8 of the semiconductor substrate 4 may be interpreted as meaning that the radiation beam is generally directed towards the face of the semiconductor substrate, such that part of the radiation beam would be incident upon the face of the semiconductor substrate if it were not blocked by other parts of the sensor S (e.g., the blocking material 10).

The photodiode 2 is arranged to measure a property of an in-band EUV radiation. The photodiode may comprise a p-n junction. An example of such photodiodes is described in U.S. Pat. No. 7,586,108 B2, U.S. Pat. No. 8,138,485 B2 and US 2012268722 A1, all three being entirely incorporated herein by reference. The photodiode 2 provides an output which is indicative of the intensity of radiation incident upon the photodiode. The photodiode may be used to measure the energy of each pulse of incident radiation for detecting fluctuations between successive radiation pulses. The photodiode may also be provided with a scintillation layer which is configured to convert EUV radiation photons into lower energy photons which may be more suitable for detection by the photodiode.

An attenuation layer may be provided on the top of the photodiode in order to reduce the amount of EUV radiation which reaches the photodiode. This may be desirable in order to avoid the photodiode becoming saturated by the high energy per pulse radiation. For example a 200 nm thick layer of aluminium or a thicker layer of TiN may be used as an attenuation layer.

The semiconductor substrate is held by a support 6. The support 6 may form part of the support MT shown in FIG. 2. The support may be made from any material, such as a first radiation blocking material. The sensor of the invention may also be construed without a support 6. However, support 6 has the advantage that it may eliminate up to 99% of the radiation beam which would be incident upon the face of the semiconductor substrate opposite to face 8, if it was not blocked by the substrate 6.

The photodiode 2 may be provided close to the edge of the semiconductor substrate 4, such that the sensor may be introduced into the EUV radiation beam without blocking a substantial proportion of it.

A layer of a first radiation blocking material 10 is provided around the photodiode 2, thereby stopping radiation incident upon active parts of the semiconductor substrate which do not form part of the photodiode. The first radiation blocking material 10 prevents radiation from passing through the face 8 of the semiconductor substrate 4 and into the semiconductor substrate. This would be undesirable because it would introduce noise into radiation measurements obtained using the photodiode 2 or it would provide the saturation of the photodiode 2.

The first radiation blocking material 10 may be any suitable material, for example a material comprising a metal suitable to block a first radiation in a predetermined wavelength range. In an embodiment, the first radiation blocking material 10 may be aluminium. The aluminium will absorb EUV radiation, thereby preventing EUV radiation from reaching the face 8 of the semiconductor substrate 4 (or reducing the amount of EUV radiation which reaches the face of the semiconductor substrate). The aluminium will also block radiation at other wavelengths (e.g., DUV and visible radiation), preventing this radiation from reaching the face 8 of the semiconductor substrate 4 (or reducing the amount of this radiation which reaches the face of the semiconductor substrate).

The first radiation blocking material 10 may be protected against oxidation induced by the environment with a protective layer on the outer surface of the blocking material. The outer surface may be protected for instance with an oxide layer (this oxide layer being different from layer 12 described below). An outer surface of the first radiation blocking material 10 may be an oxide. The oxide will provide isolation of the radiation blocking material (e.g., aluminium or other suitable metal) from the atmosphere.

In an embodiment, a stack of multilayers (e.g. two or more layers) comprising a layer of a first radiation blocking material 10 and a layer of a different material 10' may also be provided around the photodiode 2. The different material 10' may be a material which does not block the first radiation, being used for instance to protect the first radiation blocking material from oxidation or degradation (for instance to isolate from the atmosphere). The different material 10' may also be another first radiation blocking material, in order to enhance blocking of the first radiation; or in order to block radiation of a different wavelength range. For example the stack may comprise a $Si_3N_4$ layer for absorbing IR radiation, an aluminium layer for absorbing visible and/or DUV radiation and a silicon oxide layer on the top of the semiconductor substrate 4. The order of the layers in the stack is not essential, as long as it is suitable to block the undesired radiation.

The thickness of the layer of the first radiation blocking material 10 may be chosen as to have a value sufficient to provide blocking of the first radiation to a desired extent and it can be determined experimentally using standard techniques for either the situation when a single layer of a first radiation blocking material, as well as when a multilayer stack is used. A sufficiently thick layer of a first radiation blocking material 10 may be chosen to block the radiation beam 21 incident thereon. For a compact sensor design it is advantageous to have a layer thickness of the first radiation blocking material (if a single layer), or the total thickness of the multilayer stack comprising a layer of a first radiation blocking material, to be less than 1 mm, such as less than 1 microns, desirably less than 500 nm and even more desirably less than 100 nm.

A layer of a second radiation blocking material 12 is provided over the photodiode 2 and over at least part of the first radiation blocking material 10. The second radiation blocking material 12 may be provided over all of the first radiation blocking material 10, or may be provided over a portion of the first radiation blocking material which is in the vicinity of the photodiode 2 (e.g., as shown in FIG. 4).

The second radiation blocking material 12 is also provided on a side 14 of the semiconductor substrate 4. Part of the radiation beam 21 of the lithographic apparatus will be incident upon that side 14 of the semiconductor substrate 4 during operation of the lithographic apparatus.

The second radiation blocking material 12 blocks or attenuates out-of-band radiation such as visible radiation, near infra-red radiation and DUV radiation, thereby preventing this radiation from entering into the semiconductor substrate 4 from the side 14 of the semiconductor substrate (or reducing the amount of this radiation which enters from the side of the semiconductor substrate). Visible radiation, near-IR radiation and DUV radiation which enters the semiconductor substrate 4 from the side 14 is not desirable because it will introduce noise into the EUV radiation measurements performed using the photodiode 2. Suppression of this radiation by the second radiation blocking material 12 thus provides the advantage that it gives an improvement of the signal to noise ratio achieved by the sensor S. Examples of a second radiation blocking material are zirconium; and titanium nitride. Zirconium will oxidize if it is left exposed to the atmosphere. This is undesired, since if it oxidizes, it will cease to act as a filter. Therefore, zirconium may be protected (before being oxidized) by a layer of ZrN or TiN which act as a barrier to oxygen.

Typically, a sensor S is made on the top of semiconductor substrate 4 which is cut off for example from a wafer. Known sensors use a first radiation blocking material around the photodiode for the above discussed reasons. However, the edge of the semiconductor substrate 4 is normally left "naked" after dicing the wafer.

It had not previously been appreciated that radiation would enter through a side of a semiconductor substrate of a sensor, and that this radiation and/or electrons excited in the semiconductor by the radiation, would travel to the photodiode of an EUV sensor and add significant noise to the signal detected by the photodiode. Identifying that this was the case, and then providing a blocking material 12 on the side 14 of the sensor, has provided a significant and valuable improvement of the sensor S over the known prior art.

The second radiation blocking material 12 allows significant transmission of EUV radiation. This allows the photodiode 2 to measure the EUV radiation.

The second radiation blocking material 12 may also be protected with an additional top layer. The second radiation blocking material 12 may also be provided as at least a layer in a multilayer stack on a side 14 of the semiconductor substrate 4, in the same manner as described above for the first radiation material 10.

In an embodiment, the second radiation blocking material 12 comprises three layers: an inner layer of zirconium nitride, a middle layer of zirconium and an outer layer of zirconium nitride. Zirconium nitride is herein used to protect the zirconium layer from being oxidized. Alternatively, TiN or other metal nitrides can be used instead of ZrN in a sandwich configuration or as a single layer. Other materials may also be used in the sandwich configuration the second radiation blocking material 12. Also, more than 3 layers may be used alternately, as a double sandwich or other configurations where a group of layers may be repeated periodically. One example is at least a multilayer stack comprising TiN/Zr/TiN/Al/TiN. A multilayer stack designed to block a second radiation may be advantageously used to construe an out-of-band radiation filter. The inner and outer layers of zirconium nitride may for example have thicknesses of 25 nm or less. The middle layer of zirconium may for example have a thickness of 300 nm or less. The zirconium provides significant suppression of out-of-band radiation such as visible radiation and DUV radiation, but allows significant transmission of EUV radiation. The zirconium nitride inner and outer layers may prevent oxidation of the zirconium layer. Other materials may be used to protect the zirconium layer from oxidation.

The thickness of 300 nm of zirconium is selected as a thickness which provides significant suppression of out-of-band radiation such as visible and DUV radiation but which allows significant transmission of EUV radiation. However, the 300 nm thickness of zirconium is merely an example, and any other suitable thickness may be used. The thickness may be selected to provide indicative values, and other thicknesses may be used. Thicknesses may be selected to provide significant suppression of out-of-band radiation such as visible and DUV radiation but allow significant transmission of EUV radiation. The thickness of the zirconium may for example be less than 300 nm, preferably less than 200 nm.

Zirconium is merely an example of a material which may be used to form the second radiation blocking material 12. Zirconium filters out the DUV and visible radiation but is transmissive to EUV radiation. In alternative embodiment titanium nitride may be used to form the second radiation blocking material 12. Other suitable materials may be used to form the second radiation blocking material 12.

The second radiation blocking material 12 may provide significant suppression of out-of-band radiation such as visible radiation and DUV radiation but allow significant transmission of EUV radiation. The term 'significant suppression of out-of-band radiation such as visible radiation and DUV radiation' may be interpreted as meaning that the suppression is sufficient to provide a discernible reduction of the sensor noise caused by radiation which enters through the side 14 of the semiconductor substrate. The term 'significant transmission of EUV radiation' may be interpreted as meaning that EUV radiation transmission is sufficiently high to allow EUV radiation which has passed through the second radiation blocking material 12 to be measured by the photodiode 2.

Although the above refers to the second radiation blocking material 12 as providing significant suppression of visible radiation and DUV radiation, the second radiation blocking material may also provide significant suppression of radiation of other wavelengths which are not EUV radiation wavelengths. Some wavelengths such as far-infrared wavelengths (e.g., wavelengths around 10 microns) may not be detectable by the photodiode. It does not matter whether or not the second radiation blocking material 12 provides suppression of radiation at these wavelengths.

An alternative embodiment of the present invention is shown schematically in cross-section in FIG. 5. In this embodiment the photodiode 2, semiconductor substrate 4, support 6 and first radiation blocking material 10 correspond with that shown in FIG. 4. However, second radiation blocking material 16 does not extend over the photodiode 2 but instead is provided only on the side 14 of the semiconductor substrate 4 (and may be provided on part of the first radiation blocking material 10). The second radiation blocking material 16 prevents or suppresses visible and DUV radiation from entering into the semiconductor substrate 4 via the side 14. Since the second radiation blocking material 16 does not extend over the photodiode 2, it is not necessary for the second radiation blocking material to allow significant transmission of EUV radiation. Therefore, the second radiation blocking material 16 may be formed from a material which is blocking to EUV radiation in addition to being blocking to visible and DUV radiation.

The second radiation blocking material 16 may for example be aluminium or some other suitable metal. The aluminium may for example be provided as a layer having a thickness of 500 nm or more (or some other suitable thickness). An advantage of using aluminium to form the second radiation blocking material 16 is that aluminium may be relatively easily handled, and fabrication techniques using aluminium are well established.

A different metal, or any other suitable material, may be used to form the second radiation blocking material 16. The material should be blocking (or attenuating) for visible and DUV radiation, and may also be blocking (or attenuating) for EUV radiation.

The suppression of an out-of-band radiation is herein defined as the ratio between a photocurrent i1, generated by a sensor S in the absence of the second radiation blocking material 12 provided at least at the sides of the sensor to filter a second, out-of-band radiation; and a photocurrent i2, generated by the (same) sensor modified according to the invention (i.e. the second radiation blocking material 12 provided at least at the sides of the sensor). In an ideal situation i2 should be (near) zero.

The suppression of visible radiation by the second radiation blocking material 12 of the first embodiment may for example be around a factor of 50. The suppression of visible radiation provided by the second radiation blocking material 16 of the second embodiment may for example be around a factor of around 500. The suppression provided by the second radiation blocking material 16 of the second embodiment may be greater than that provided by the second radiation blocking material 12 of the first embodiment because there is no need for the blocking material to allow transmission of EUV radiation. Desirably the suppression is of at least a factor 10, more desirably at least a factor 50, even more desirably at least a factor 100 and most desirably at least a factor 1000.

The second radiation blocking material 12, 16 may be provided on the sensor S using known techniques such as evaporation techniques. A tolerance (e.g., +/−10%) may be applied to examples of thickness values given further above, to take into account inaccuracies in the thickness of material provided by the technique used to provide the second radiation blocking material 12, 16 on the sensor. A greater difference (e.g., +/−40%) may be seen between the thickness of second radiation blocking material 12 on the side 14 of the semiconductor substrate 4 and on the downward facing surface 10 of the first radiation blocking material (the difference arising if a directional technique is used to provide the second radiation blocking material).

Depending upon the technique used to provide the second radiation blocking material 12, 16, the second radiation blocking material may have an uneven thickness (e.g., thinner on the side of the semiconductor substrate 4 in the embodiment shown in FIG. 4). A substantial tolerance (e.g., +/−20%) may be applied to examples of thickness values given further above.

Although the sensor S illustrated in the figures comprises a single photodiode 2, the sensor may comprise a plurality of photodiodes. The plurality of photodiodes may for example comprise an individual photodiode arranged to measure radiation beam intensity and a photodiode array arranged to detect an image (or any other combination of different forms of photodiodes). The plurality of photodiodes may be provided on a single semiconductor substrate. In addition, one or more sensors S may be coupled with other sensors to provide simultaneously different information. For example, the sensor according to the invention may be coupled with a temperature sensor placed at face 8 according to the figures. The temperature sensor may be configured to detect infrared radiation desirably with a response time less than 50 ms. When the temperature sensor detects an increase in temperature as compared to a threshold temperature, a feedback signal can be provided which shows that sensor S does not work according to the set parameters.

Although the illustrated embodiments show the sensor S in a lithographic apparatus, the sensor may be provided in other apparatus. For example, the sensor may be provided in a radiation source apparatus, a metrology apparatus or an inspection apparatus (e.g., an apparatus used to measure properties of a patterned substrate). The metrology or inspection apparatus may comprise a radiation source arranged to illuminate a substrate to be inspected, a sensor arranged to detect radiation reflected from the illuminated substrate, and a processor arrange to analyze the detected radiation. The sensor may for example be in the form of an array of photodiodes arranged to detect an image, or may have some other form.

An outer surface of the photodiode 2 may be provided with one or more filters which are arranged to filter out non-EUV radiation. The one or more filters may also be arranged to reduce the amplitude of EUV radiation in order to avoid saturation of the photodiode 2.

The first radiation blocking material 10 may include a layer of silicon nitride (or some other material which absorbs infrared radiation). The silicon nitride will absorb infrared radiation, and may for example be used as part of a temperature sensor which is arranged to monitor for the presence of infrared radiation via temperature changes of the silicon nitride. The infrared radiation being monitored for may be far-infrared radiation generated by the laser LA (see FIG. 3), and may for example have a wavelength of 10.6 microns The side 14 of the semiconductor substrate 4 is perpendicular (or substantially perpendicular) to the face 8 of the semiconductor substrate in the illustrated embodiments. However, the side 14 may be at some other angle relative to the face 8 of the semiconductor substrate.

A sensor S according to an embodiment of the present invention may be provided at any location in the lithographic apparatus at which it may be useful to measure the intensity of the radiation beam (or some other property of the radiation beam). A radiation blocking material may be provided on a side of a photodiode bearing substrate if the photodiode is sufficiently close to the side of the substrate that noise would be generated by radiation passing into the side of the substrate.

Cartesian coordinates are shown in the Figures and are used in the above description. The Cartesian coordinates are intended to facilitate understanding of the present invention, and are not intended to mean that the sensor or other parts of the lithographic apparatus must have a particular orientation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents, including also the following clauses:

1. A lithographic apparatus comprising:
   an illumination system configured to condition a radiation beam;
   a support configured to support a patterning device, the patterning device being capable of imparting the radiation beam with a pattern in its cross-section to form a patterned radiation beam;
   a substrate table configured to hold a substrate;
   a projection system configured to project the patterned radiation beam onto a target portion of the substrate; and
   a sensor comprising:
     a photodiode provided on a face of a semiconductor substrate towards which the radiation beam is directed during operation of the lithographic apparatus,
     a first radiation blocking material being provided around the photodiode on the face of the semiconductor substrate, and
     a second radiation blocking material is provided on a side of the semiconductor substrate upon which the radiation beam is incident during operation of the lithographic apparatus.

2. The lithographic apparatus of clause 1, wherein the side of the semiconductor substrate is substantially perpendicular to the face of the semiconductor substrate.

3. The lithographic apparatus of clause 1, wherein the second radiation blocking material is also provided over the photodiode.

4. The lithographic apparatus of clause 3, wherein the second radiation blocking material provides significant suppression of visible and DUV radiation, while allowing significant transmission of EUV radiation.

5. The lithographic apparatus of clause 3, wherein the second radiation blocking material comprises zirconium or titanium nitride.

6. The lithographic apparatus of clause 1, wherein the second radiation blocking material is not provided over the photodiode.

7. The lithographic apparatus of clause 6, wherein the second radiation blocking material provides significant suppression of visible and DUV radiation.

8. The lithographic apparatus of clause 7, wherein the second radiation blocking material provides significant suppression of EUV radiation 9. The lithographic apparatus of clause 6, wherein the second radiation blocking material comprises aluminum.
10. The lithographic apparatus of clause 1, wherein the photodiode is one of a plurality of photodiodes provided on the face of the semiconductor substrate
11. The lithographic apparatus of clause 1, wherein the sensor is provided on the support.
12. A sensor comprising:
   a photodiode provided on a face of a semiconductor substrate,
   a first radiation blocking material being provided around the photodiode on the face of the semiconductor substrate, and
   a second radiation blocking material is provided on a side of the semiconductor substrate.
13. A metrology or inspection apparatus comprising the sensor of clause 12.
14. A lithographic method comprising:
   conditioning a radiation beam using an illumination system of a lithographic apparatus; and
   measuring the radiation beam using a sensor, the sensor comprising a photodiode provided on a face of a semiconductor substrate towards which the radiation beam is directed during operation of the lithographic apparatus, a first radiation blocking material being provided around the photodiode on the face of the semiconductor substrate, and a second radiation blocking material is provided on a side of the semiconductor substrate upon which the radiation beam is incident during operation of the lithographic apparatus.

The invention claimed is:

1. A sensor for measuring a property of an in-band radiation, comprising:
   a photodiode provided on a face surface of a semiconductor substrate;
   a first radiation blocking material being provided around the photodiode on the face surface of the semiconductor substrate; and
   a second radiation blocking material being provided on a side surface of the semiconductor substrate, which is different from the face surface of the semiconductor substrate,
   wherein the second radiation blocking material provides significant suppression of an out-of-band radiation.

2. The sensor of claim 1, wherein the in-band radiation is an extreme ultraviolet (EUV) radiation.

3. The sensor according to claim 1, wherein the out-of-band radiation comprises one or more of visible, (near-) infra-red (IR) and deep ultra-violet (DUV) radiation.

4. The sensor according to claim 1, wherein the first radiation blocking material comprises a metal.

5. The sensor according to claim 1, wherein the second radiation blocking material is provided over the photodiode.

6. The sensor according to claim 5, wherein the second radiation blocking material allows significant transmission of EUV radiation.

7. The sensor according to claim 1, wherein the second radiation blocking material is not provided over the photodiode.

8. The sensor according to claim 7, wherein the second radiation blocking material provides significant suppression of visible, EUV and DUV radiation.

9. The sensor according to claim 1, wherein the second radiation blocking material comprises zirconium, or titanium nitride.

10. The sensor according to claim 1, wherein the photodiode is one of a plurality of photodiodes provided on the face surface of the semiconductor substrate.

11. The sensor according to claim 1, wherein the sensor is provided on a support.

12. The sensor according to claim 1, wherein at least one of the first or second radiation blocking material forms a layer in a multilayer stack.

13. The sensor according to claim 1, wherein the second radiation blocking material comprises a multilayer stack.

14. The sensor according to claim 13, wherein the second radiation blocking material comprises three layers.

15. The sensor according to claim 1, wherein:
   the second radiation blocking material is provided on a side surface of the first radiation blocking material, and
   the side surface of the first radiation blocking material is different than the face surface of the semiconductor substrate.

16. An apparatus comprising:
   an optical system configured to condition a radiation beam; and
   a sensor comprising a photodiode provided on a face surface of a semiconductor substrate towards which the radiation beam is directed during operation of the apparatus, wherein a first radiation blocking material is provided around the photodiode on the face surface of the semiconductor substrate, and wherein a second radiation blocking material is provided on a side surface of the semiconductor substrate, which is different from the face surface of the semiconductor substrate, upon which the radiation beam is incident during operation of the lithographic apparatus.

17. An apparatus according to claim 16, wherein the apparatus is one of a lithographic apparatus, a radiation source apparatus, a metrology apparatus or an inspection apparatus for inspecting a property of a surface.

18. A lithographic method comprising:
   conditioning a radiation beam using an illumination system of a lithographic apparatus; and
   measuring the radiation beam using a sensor, the sensor comprising a photodiode provided on a face surface of a semiconductor substrate towards which the radiation beam is directed during operation of the lithographic apparatus, a first radiation blocking material being provided around the photodiode on the face surface of the semiconductor substrate, and a second radiation blocking material provided on a side surface of the semiconductor substrate, which is different from the face surface of the semiconductor substrate, upon which the radiation beam is incident during operation of the lithographic apparatus.

* * * * *